(12) United States Patent
Ciesielski

(10) Patent No.: US 7,259,635 B2
(45) Date of Patent: Aug. 21, 2007

(54) ARBITRARY FREQUENCY SIGNAL GENERATOR

(76) Inventor: Joerg Ciesielski, Kluetschgasse 6, Cologne (DE) 50825

( * ) Notice: Subject to any disclaimer, the term of this patent is extended or adjusted under 35 U.S.C. 154(b) by 175 days.

(21) Appl. No.: 11/104,555

(22) Filed: Apr. 13, 2005

(65) Prior Publication Data
US 2006/0232343 A1    Oct. 19, 2006

(51) Int. Cl.
H03K 3/03 (2006.01)
H03L 7/85 (2006.01)
H03L 7/89 (2006.01)

(52) U.S. Cl. .......................... 331/57; 331/1 A; 327/160
(58) Field of Classification Search ............... 331/1 A, 331/57; 327/160
See application file for complete search history.

(56) References Cited

U.S. PATENT DOCUMENTS 6,404,247 B1 *  6/2002  Wang ...................... 327/158
6,507,247 B2 *  1/2003  Langston .................. 331/47

* cited by examiner

Primary Examiner—Benny Lee
Assistant Examiner—James Goodley

(57) ABSTRACT

The present invention is based on the objective of constructing a PLL as arbitrary frequency generator for frequency multiplication purposes without utilizing a VCO. The invention shows a solution which can be realized with a pure digital circuit which can be easily integrated on a chip. In digital oscillators, the frequency can be changed, by changing over the number of time-delay elements. It is also possible to realize very slight frequency changes per switching stage by changing over between different elements with very similar delay times. In addition, a pulse-width modulator is utilized that periodically changes over between two or more of these stages and consequently different frequencies. Furthermore a PLL is introduced using such a frequency generator.

6 Claims, 3 Drawing Sheets

PLL with Frequency Generator with Digitally Adjustable Frequency and Adjustable Frequency Multiplier N ($F_{OUT} = F_{REF} * N$)

Fig. 1: PLL with Frequency Generator with Digitally Adjustable Frequency and Adjustable Frequency Multiplier N ($F_{OUT} = F_{REF} * N$)
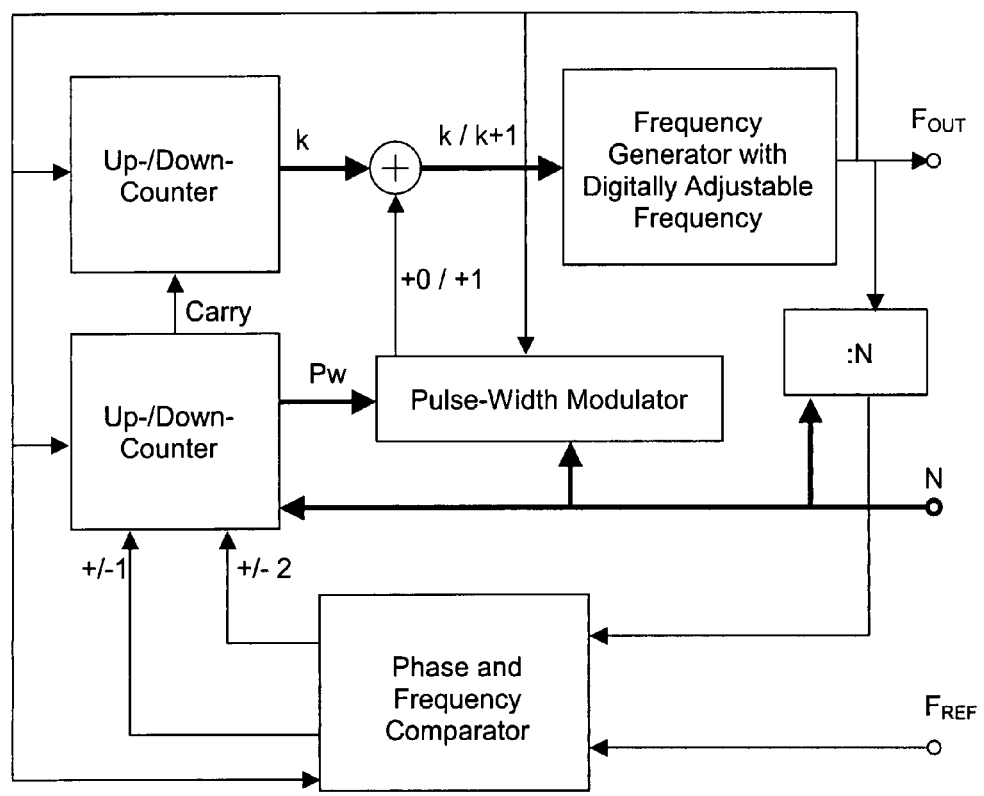

Fig. 2: Assembly of the Output Frequency with Pulses of two different Frequencies $F_1$ and $F_2$
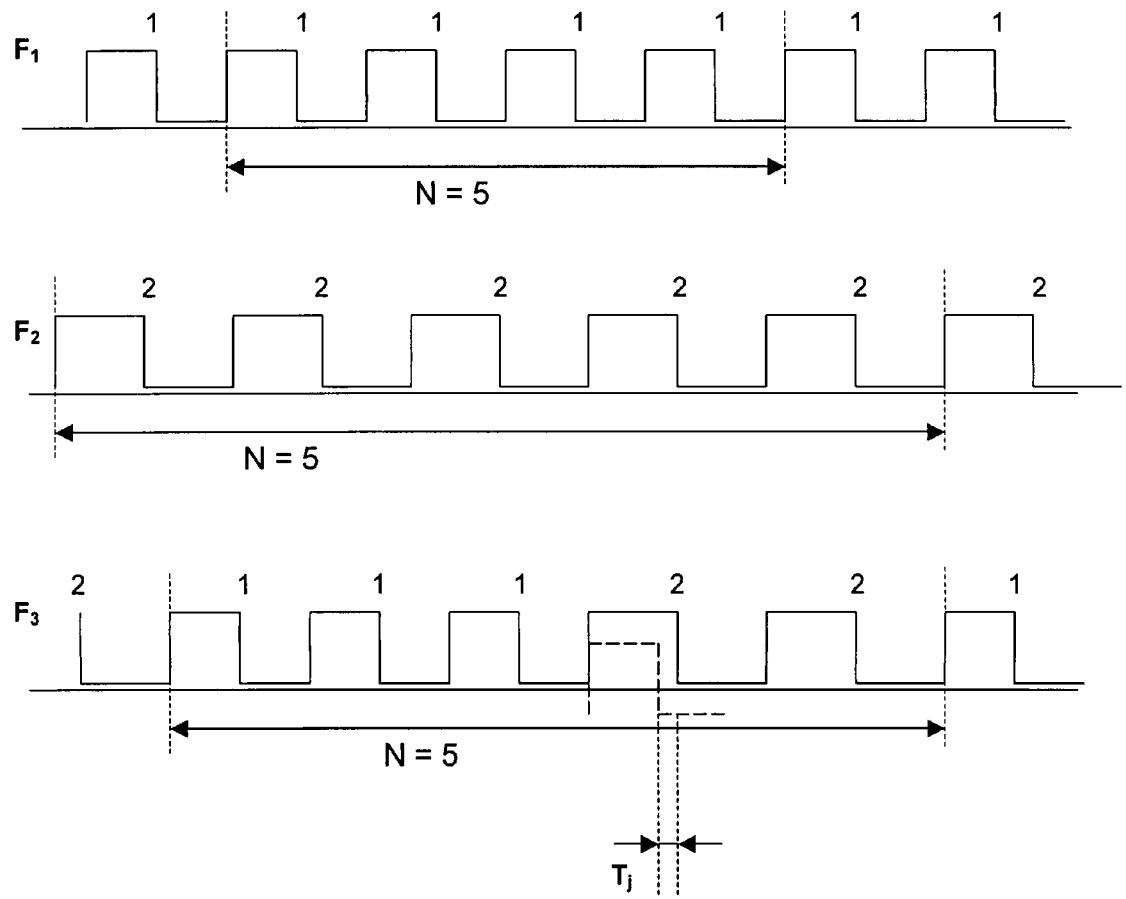
For $F_3$: Pw = 3, N = 5
$F_3 = 5 / (3/F_1 + 2/F_2)$
$T_j = |\ 1/F_1 - 1/F_2\ |$ Fig. 3: Sample Realization of a Frequency Generator with
Digitally Adjustable Frequency
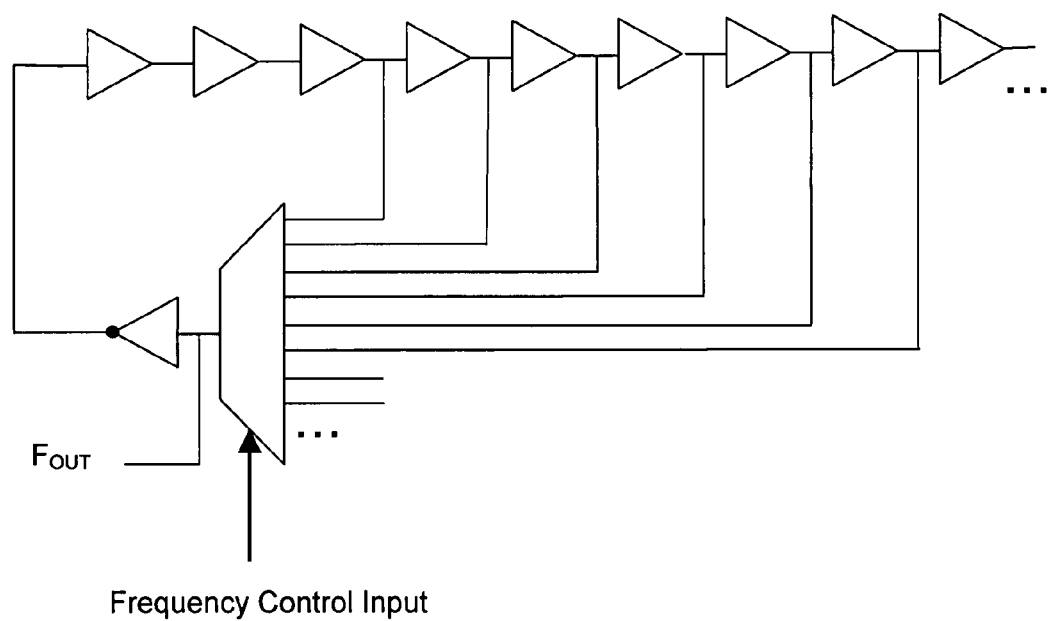
F<sub>OUT</sub>
Frequency Control Input

ARBITRARY FREQUENCY SIGNAL GENERATOR

FIELD OF THE INVENTION

The Invention covers the field of electronic engineering, especially the generation of a digital clock frequency. Because the invention is suited to be integrated into an integrated circuit the invention also covers digital chip design.

BACKGROUND

Frequency generators are broadly utilized in the field of digital engineering, particularly as clock generators. However, numerous applications not only require fixed frequencies such as those generated, e.g., by quartz oscillators, but also digitally adjustable frequencies. Certain applications also require very high frequencies that should be created exclusively on a chip and not externally supplied due to power dissipation and EMC.

According to the state of the art, the PLLs (Phase Locked Loops) utilized for this purpose contain an oscillator in the form of a VCO (Voltage Controlled Oscillator). The disadvantage of these oscillators is that the control voltage that defines the frequency needs to be very precise and free of interferences because any interference voltage on the control voltage leads to frequency changes and consequently to a jitter in the generated frequency.

SUMMARY OF THE INVENTION

The present invention is based on the objective of constructing a PLL for frequency multiplication purposes without utilizing a VCO. The invention shows a solution which can be realized with a pure digital circuit which can be easily integrated on a chip.

BRIEF DESCRIPTION OF THE DRAWINGS

FIG. 1 shows one embodiment of the PLL using a frequency generator with the characteristics of the invention.

FIG. 2 shows the assembling of the output frequency with pulses of two different frequencies.

FIG. 3 shows a sample embodiment of the Frequency Generator with Digitally Adjustable Frequency.

DETAILED DESCRIPTION OF THE INVENTION

According to the invention, this objective is attained in that an oscillator is utilized that can be switched in stages. For this purpose, it is possible to utilize, for example, R/C oscillators or L/C oscillators, in which one of the components that define the frequency is changed over or switched in. However, circuits of this type are already known in connection with quartz oscillators and L/C oscillators as prior art.

Oscillators consisting of digital gates or similar time-delay elements are particularly suitable for being incorporated into an integrated circuit (IC) because the realization of capacitors and coils requires a large surface. In digital oscillators, the frequency can be changed, e.g., by changing over the number of time-delay elements. It is also possible to realize very slight frequency changes per switching stage by changing over between different elements with very similar delay times.

In addition, a pulse-width modulator is utilized that periodically changes over between two or more of these stages and consequently different frequencies. So clock by clock the output of the pulse-width modulator determines which frequency is used. According to FIG. 2, this results in the generation of pulses with a different width (1 or 2) for assembling the output signal. If all pulses have the frequency 1, this frequency is also generated; if all pulses have the frequency 2, this frequency is generated. All intermediate frequencies can be generated by suitably assembling pulses with the frequencies 1 and 2 (FIG. 2). The smaller the frequency difference between the two frequencies, the lower the jitter of the output frequency. In this case, the magnitude of the pulse-to-pulse jitter is not dependent on the pulse width of the pulse-width modulator because a jitter only occurs when changing over between the frequencies.

At a period N of the pulse-width modulator the output of the modulator is 1 for Pw clocks and 0 for N-Pw clock times.

At a period N of the pulse-width modulator and two frequencies $F_1$ and $F_2$, the following applies, on average, to the output frequency for a pulse-width adjustment Pw (0 ... N):

$$F_{OUT}=N/[((1/F_1)\times Pw)+((1/F_2)\times(N-Pw))]$$

According to FIG. 1 the output frequency can be varied in N stages by changing Pw. If Pw is also changed in dependence on a reference frequency, any arbitrary frequency can be generated with arbitrary accuracy over extended periods of time.

If the intrinsic jitter of $F_1$ and $F_2$ is neglected, the maximum jitter in this case is:

$$T_j=|1/F_1-1/F_2|$$

A PLL can be constructed in such a way that the phase and the frequency of the signal divided by N in the oscillator are compared with the reference frequency. In this case, a frequency difference or phase difference leads to a change of the pulse width value (Pw) by +/−2. This arrangement is helpful because a phase crossing between the divided oscillator frequency and the reference frequency needs to be compensated in such a way that the phase is corrected once again after a short period of time, namely due to another phase crossing in the opposite direction. So any phase crossing between the divided oscillator frequency and the reference frequency adjusts the Pw value by +2 or −2. Consequently, the phase of the divided oscillator signal also swings around the phase of the reference frequency. If the two change-over frequencies $F_1$ and $F_2$ or the reference frequency changes such that a phase balance is not achieved after a few cycles, both frequencies are changed by +/−1 by changing Pw. This change is carried out in such a way that the phase balance is achieved once again after a few cycles. So the center frequency of the PLL is adjusted by changing the Pw value by +1 or −1.

Due to the change of +/−1 for the center frequency and +/−2 for the phase, the phase and consequently the generated frequency always swings around the nominal frequency. Naturally, it would also be possible to adjust +/−A stages instead of +/−2 stages and to adjust +/−B stages instead of +/−1 stage. As long as A>B, this also results in a stable PLL. When synchronizing the PLL, greater frequency changes per stage are quite desirable because this reduces the time required for the synchronization process.

It is sensible to adjust the period N of the pulse-width modulator to the division factor N because a phase jitter between the divided oscillator frequency and the reference frequency would otherwise already occur although Pw is constant. This can lead to the faulty detection of phase errors in the phase detector.

If the output frequency of the oscillator can no longer be sufficiently adjusted for generating the desired frequency by changing the pulse width ratio of the pulse-width modulator, it is necessary to change over between two other frequencies by adapting the oscillator. The carry signal of the up/down counter used for the pulse width adjustment Pw is utilized for this purpose. The value k that defines the lower of the two change-over frequencies is adjusted by a second up/down counter. The oscillator that can be adjusted stage-by stage consequently is adjusted to the frequencies F(k) and F(k+1) by changing over the values k and k+1.

The invention claimed is:

1. A frequency generator with digitally adjustable frequency for an integrated circuit, comprising an oscillator that consists of stages of time-delay elements and the frequency of which can be adjusted digitally stage-by-stage in the oscillator, as well as a dedicated pulse-width modulator, characterized in that an arbitrary output frequency is generated by continuously changing over between at least two different frequencies, by means of the pulse-width modulator.

2. A Phase Locked Loop (PLL) with an adjustable frequency generator according to claim 1, characterized in
that the frequency generator is utilized as an adjustable oscillator in the PLL.

3. The Phase Locked Loop (PLL) according to claim 2, characterized in
that the generated frequency is compared with a reference frequency and a deviation causes the pulse width of the pulse-width modulator to change by +/−2 stages.

4. The Phase Locked Loop (PLL) according to claim 2, characterized in that the generated frequency is divided before it is compared with a reference frequency, and in that the period of the pulse-width modulator corresponds to the frequency division factor.

5. The Phase Locked Loop (PLL) according to claim 2, characterized in
that the pulse width of the pulse-width modulator is changed by +/−1 stage in cases, in which the phase position of the generated frequency does not correspond to the phase position of the reference frequency once again after a few cycles.

6. The Phase Locked Loop (PLL) according to claim 2, characterized in that the generated frequency is compared with a reference frequency and a deviation causes the pulse width of the pulse-width modulator to change by +/−A stages and that the pulse width of the pulse-width modulator is changed by +/−B stages in cases, in which the phase position of the generated frequency does not correspond to the phase position of the reference frequency once again after a few cycles, and in that A>B.

* * * * *